April 1, 1969 W. F. PARMER 3,436,281

FIELD-EFFECT TRANSISTORS

Original Filed Aug. 14, 1962

W. F Parmer
INVENTOR

BY Kenneth R. Glaser

ATTORNEY 3,436,281
Patented Apr. 1, 1969

3,436,281

FIELD-EFFECT TRANSISTORS

Will F. Parmer, Dallas, Tex., assignor to Texas Instruments Incorporated, Dallas, Tex., a corporation of Delaware Original application Aug. 14, 1962, Ser. No. 216,843. Divided and this application Oct. 1, 1965, Ser. No. 509,233
Int. Cl. H01l 7/44, 11/00
U.S. Cl. 148—187 3 Claims

ABSTRACT OF THE DISCLOSURE

A process is disclosed for manufacturing a field-effect transistor utilizing oxide masking techniques for diffusing impurities into one surface of a semiconductor wafer to form a thin enclosed surface layer of opposite conductivity type from the wafer. A further oxide masking and diffusion step is effected to define a narrow elongated surface region at the one surface, the major portion of this elongated area being within the enclosed surface layer, but having extended portions lying outside of the enclosed surface area which make non-rectifying contact to the undiffused portion of the wafer surface so that this surface region divides the surface layer into source and drain regions, which are electrically connected within the wafer only by a thin channel underlying the surface region and so that the wafer and the surface region provide the lower and upper gates for the field-effect transistor.

This application is a division of application Ser. No. 216,843, filed Aug. 14, 1962, now abandoned.

This invention relates to semiconductor devices and more particularly to diffused field-effect transistors and a fabrication technique therefor.

Field-effect transistors are preferably fabricated in the double-gate geometry since this configuration offers the advantages of higher transconductance and lower pinch-off voltage. This results from the fact that two gates provide two depletion regions moving toward one another rather than a single depletion region moving toward the surface of the semiconductor. It is usually desirable to connect the two gates electrically, but heretofore this connection is made by providing electrical contacts on both gates and connecting a lead between the contacts. This adds several steps to the fabrication procedure, resulting in more chances for mistakes and reducing yield. Also, the completed devices have inherently lower reliability due to the additional structural elements. The necessity of making electrical connection to the second gate requires that the dimensions of the gate be adequate to facilitate depositing contact material and bonding a lead to the contact. This needlessly expands the gate area, resulting in an increase in the capacitance between the gate and the other regions, limiting the frequency response of the device. Also, the length of the channel from source to drain is preferably quite short, but this requirement is inconsistent with the necessity for placing an electrical contact on the gate.

Accordingly, it is the principal object of this invention to provide a double-gate field-effect transistor adapted for fabrication by diffusion techniques which does not require external connections between the two gates.

An additional object is to provide an improved field-effect transistor. Another object is to provide a diffused field-effect transistor having internally-connected gates. A further object is to provide a simplified technique for fabricating semiconductor devices such as field-effect transistors.

In accordance with this invention, a field-effect transistor is fabricated by a double-diffusion technique wherein the channel is first diffused into a wafer of semiconductor material and then the top gate is diffused into the channel region. The diffusion patterns are such that the top gate region produced by the second diffusion will be ohmically connected with the semiconductor crystal to the undiffused bulk of the wafer, the latter portion forming the second gate. Thus, the two gate regions are internally connected together without requiring an additional bonded contact and lead.

The novel features, objects and advantages of the present invention will become readily apparent from the following description when taken in conjunction with the appended claims and detailed drawings wherein:

Figure 1:
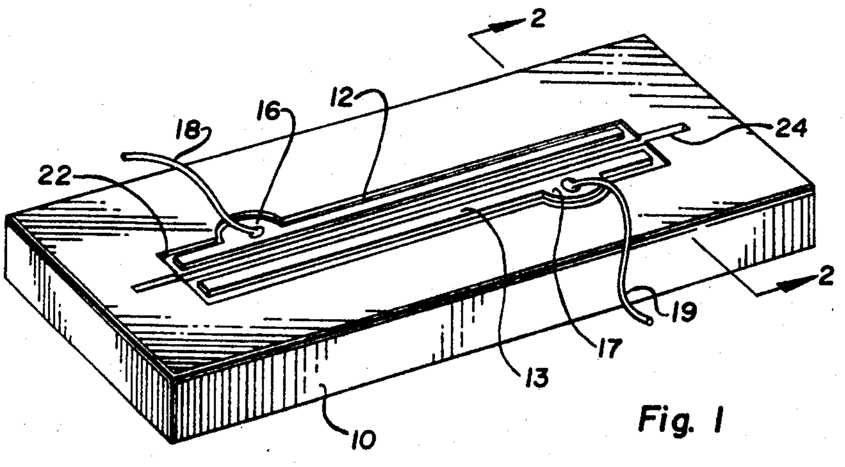
FIGURE 1 is a greatly enlarged pictorial view of a field-effect transistor constructed according to this invention.
Figures 2, 3:
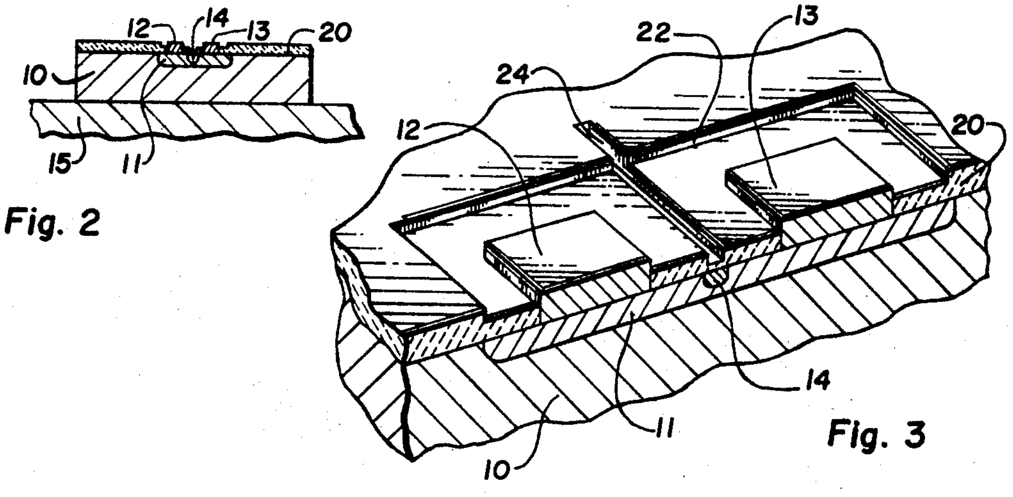
FIGURE 2 is a sectional view of the device of FIGURE 1 taken along the lines 2—2.
FIGURE 3 is a greatly enlarged, fragmentary, pictorial view in section of the active area of the device of FIGURE 1, also viewed along the lines 2—2.

With reference to FIGURES 1 and 2, a field-effect transistor of the double-diffused planar type having a P-type channel and internally-connected gates is illustrated. This device is costructed on an N-type silicon wafer 10, which forms the lower gate, and includes a diffused P-type region 11 forming channel, source and drain regions. A source contact 12 and a drain contact 13 are positioned on opposite sides of the region 11. A diffused N-type region 14, forming the top gate, is provided to separate the source and drain, and to define the limits of the P-type channel. According to this invention, this second diffused region 14 extends beyond the ends of the P-type diffused region 11 and so makes ohmic contact to the N-type parent wafer 10. Thus, the top gate region 14 and the bottom gate defined by the wafer 10 are connected together, and so a single gate connection is all that is necessary. This gate connection is made by bonding or soldering the back of the wafer 10 to a conductive plate 15 which may be a conventional transistor header. The source and drain contacts 12 and 13 may have enlarged areas 16 and 17 to which leads 18 and 19 may be easily bonded. These leads would be connected to studs in the transistor header in accordance with conventional packaging techniques. The device is preferably fabricated by oxide masking techniques and so an oxide layer 20 remains on the top surface of the silicon wafer to protect the P-N junctions.

A method for fabricating the devices illustrated in FIGURES 1 and 2 may best be described with reference to FIGURE 3, which is a greatly enlarged sectional view of a small portion of the wafer 10 in the active area. The original wafer, from which many of the devices may be made simultaneously, may be doped with phosphorus upon growing to a level which produces a resistivity of greater than about one ohm-cm. The top surface of the wafer 10 is first polished and cleaned, then a silicon oxide layer is applied by passing steam over the heated wafer, for example. A generally rectangular opening 22 defining the outline of the region 11 is then formed in the oxide by photo-resist masking techniques, exposing the bare silicon within this area. This opening 22 could be perhaps 60 mils long by 6 mils wide, for example. The region 11 is thereafter formed by depositing boron on the surface of the wafer and then heating to a temperature of about 1200° C. or over for a time sufficient to provide a junction depth of about 0.15 mil. At the same time, an oxide coating 23 is formed over the area exposed by the opening 22. A second photo-resist masking step is then performed to define an elongated narrow opening 24 above what will be the region 14, exposing a narrow area of the surface of the wafer perhaps 0.5 mil wide and 65 mils long. The major portion of the length of this opening 24 lies over the region 11, but it is seen that the ends extend over the un-diffused area of the wafer. The region 14 is then formed by depositing phosphorus on the wafer surface and heating at a temperature of perhaps 1200° C. or more for several hours or until a junction depth of about 0.10 mil results. The junction depths are of interest primarily due to the fact that a channel thickness of about 0.05 mil provides particularly advantageous characteristics. During the N-type diffusion, more oxide is formed on the wafer surface, and covers the region 14 or opening 24. This oxide coating is of course left on the device to protect the surface. The source and drain contacts 12 and 13 are then made by selectively etching holes in the oxide coating and then evaporating aluminum onto the surface and removing the unwanted aluminum by masking and etching.

Figure 4:
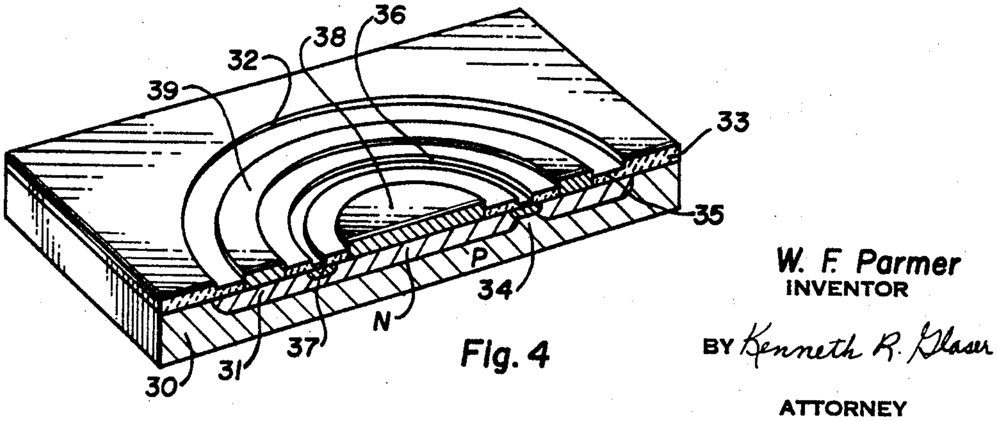
FIGURE 4 is a pictorial view in section of another embodiment of a field-effect transistor constructed according to this invention.

With reference to FIGURE 4, there is shown a field-effect transistor of circular geometry which employs the internally-connected gates of this invention. Assuming that an N-type channel is desired, a P-type silicon wafer 30 is utilized, and an N-type diffused region 31 is formed in the top surface by oxide masking techniques comprising opening a circular hole 32 in an oxide coating 33 and diffusing from a deposited phosphorus source. A very small portion of the oxide coating 33 is left intact within the area exposed by the opening 32, providing a diffusion mask for a small area under what will subsequently be the top gate. This small masked area will remain un-diffused and a portion 34 of the parent material will extend to the surface. After the first diffusion step, which also forms another oxide coating 35 over the previously-exposed surface, a ring-shaped opening 36 is cut in the oxide by photo-resist masking and etching. Boron is deposited on the top surface of the wafer and diffused through the ring-shaped opening 36 to form a ring-shaped diffused region 37 which is the top gate. This region 37 is spaced from the P-N junction outlining the region 31 by perhaps 0.05 mil, except for the portion overlying the un-diffused region 34. Here the P-type material of the wafer 30 and the P-type diffused region 37 overlap, providing the desired internal connection of the gates. Simultaneously with the P-type diffusion, an oxide coating is formed over the opening 36, and this coating remains on the device for surface passivation. A circular contact 38 and a ring-shaped contact 39, providing the source and drain connections are then applied by removing correspondingly-shaped areas of the oxide coating 35 and depositing aluminum in the exposed surface areas. The single gate connection is made by bonding the wafer 30 to a conductive plate (not shown) such as a transistor header as suggested above.

While the device of FIGURE 4 is of circular geometry, the principles could be equally well applied to any closed or concentric configuration. Thus, a rectangular pattern wherein the top gate encloses the source or drain could be fabricated in the same manner as described above, the only difference being in the shapes of the masks used. Of course, either of the preferred embodiments set forth above could have either P-type or N-type gates.

It is seen that the basic feature of this invention is the concept of masking the channel diffusion in such a fashion that a portion of the parent material remains un-diffused. The gate diffusion is then made so that impurities are diffused into both the channel region and into a portion of the parent material remaining on the surface of the wafer. Of course, in speaking of the parent material in this sense, it is contemplated that this may as well be itself a diffused region, in which case a triple-diffused device would be provided. Also, even though the examples given above describe only diffusion for making the top gate region, the concepts of this invention, in its broadest aspects, may well be applied to a double-gate field-effect transistor wherein the top gate is provided by an alloyed region.

Accordingly, although the invention has been described with reference to illustrative embodiments, this description is not meant to be construed in a limiting sense. It is of course understood that various modifications may be made by persons skilled in the art, and so it is contemplated that appended claims will cover any such modifications as fall within the true scope of the invention.

What is claimed is:

1. A method of manufacturing a double-diffused silicon field-effect transistor comprising the steps of:

(a) forming an oxide coating upon a surface of a wafer of semiconducting silicon, (b) forming an opening in said coating exposing a limited area of said surface of lateral dimensions suitable for the source, drain and channel regions of the transistor, (c) diffusing at an elevated temperature impurity material into the wafer through said opening in the oxide coating to form a thin surface layer limited in lateral extent by the size of the opening in the oxide coating, a P-N junction being formed at the interface between the surface layer and the remainder of the wafer and extending to said surface beneath the oxide coating to define an enclosed surface area, (d) forming a further oxide coating upon said surface of the wafer covering said opening in the previous oxide coating, (e) forming an opening in the oxide coatings on the surface of the wafer exposing a narrow elongated area of said surface, the major portion of the elongated area being within said enclosed surface area but extended portions thereof lying outside the enclosed surface area so that small portions of the P-N junction and of the undiffused part of the wafer are exposed, (f) diffusing at an elevated temperature impurity material into the wafer through the opening in the oxide coatings to form a shallow surface region limited in lateral extent by the size of such opening, a P-N junction being fromed at the interface between the surface region and the surface layer and extending to said surface beneath the oxide coating, the surface region under said extended portions being coextensive with and making nonrectifying contact to said undiffused part of the wafer, the surface region dividing the surface layer into source and drain regions which are connected within the wafer only by a thin channel underlying the surface region so that the wafer and the surface region provide lower and upper gates for the field-effect transistor, (g) and providing nonrectifying contacts to the source and drain regions of the surface layer through the oxide coating thereon and a nonrectifying contact to the wafer spaced away from the surface layer.

2. A method of manufacturing a double-diffused field-effect transistor comprising the steps of:

(a) forming a coating upon a surface of a wafer of semiconductor material, (b) forming an opening in said coating exposing a limited area of said surface of lateral dimensions suitable for the source, drain and channel regions of the transistor, a small centrally-located segment of the coating within said opening remaining intact, (c) diffusing at an elevated temperature impurity material into the wafer through said opening in the coating to form a thin surface layer limited in lateral extent by the size of the opening in the coating, a P-N junction being formed at the interface between the surface layer and the remainder of the wafer and extending to said surface beneath the coating to define an enclosed surface area, a small region beneath said small segment remaining undiffused, (d) forming a further coating upon said surface of the wafer covering said opening in the previous coating, (e) forming an opening in the coatings on the surface of the wafer exposing a narrow closed elongated strip of said surface, the entirety of the elongated strip being within said enclosed surface area, a small portion of the strip overlying said small undiffused region of the wafer, (f) diffusing at an elevated temperature impurity material into the wafer through the opening in the coatings to form a shallow surface region limited in lateral extent by the size of such opening, a P-N junction being formed at the interface between the surface region and the surface layer and extending to said surface beneath the coating, the surface region under said small portion of the elongated strip being coextensive with and making non-rectifying contact to said small undiffused region of the wafer, the surface region dividing the surface layer into source and drain regions which are connected within the wafer only by a thin channel underlying the surface region so that the wafer and the surface region provide lower and upper gates for the field-effect transistor, (g) and providing non-rectifying contacts to the source and drain regions of the surface layer through the oxide coating thereon and a non-rectifying contact to the wafer spaced away from the surface layer.

3. A method of manufacturing a field-effect transistor comprising the steps of:

(a) forming a coating upon a surface of a wafer of semiconductor material, (b) forming an opening in said coating exposing a limited area of said surface of lateral dimensions suitable for the source, drain and channel regions of the transistor, (c) diffusing at an elevated temperature impurity material into the wafer through said opening to form a thin surface layer limited extent by the size of the opening in the coating, a P-N junction being formed at the interface between the surface layer and the remainder of the wafer and extending to said surface beneath the coating to define an enclosed surface area, (d) forming a further coating upon said surface of the wafer covering said opening in the previous coating, (e) forming an opening in the coatings on the surface of the wafer exposing a narrow elongated area of said surface, the major portion of the elongated area being within said enclosed surface area but extended portions thereof lying outside the enclosed surface area so that small portions of the P-N junction and of the undiffused part of the wafer are exposed, (f) diffusing at an elevated temperature impurity material into the wafer through the opening in the coatings to form a shallow surface region limited in lateral extent by the size of such opening, a P-N junction being formed at the interface between the surface region and the surface layer and extending to said surface beneath the coating, the surface region under said extended portions being coextensive with and making non-rectifying contact to said undiffused part of the wafer, the surface region dividing the surface layer into source and drain regions which are connected within the wafer only by a thin channel underlying the surface region so that the wafer and the surface region provide lower and upper gates for the field-effect transistor, (g) and providing non-rectifying contacts to the source and drain regions of the surface layer through the coating thereon and a non-rectifying contact to the wafer spaced away from the surface layer.

References Cited

UNITED STATES PATENTS

| | | | |
|---|---|---|---|
| 2,802,760 | 8/1957 | Derick et al. | 148—187 |
| 3,122,817 | 3/1964 | Andrus | 148—187 |
| 3,156,593 | 11/1964 | Ligenza | 148—189 |
| 3,183,128 | 5/1965 | Leistiko et al. | 148—187 |
| 3,183,129 | 5/1965 | Tripp | 148—187 |
| 3,226,611 | 12/1965 | Haenichen | 148—187 |

L. DEWAYNE RUTLEDGE, *Primary Examiner.*

R. A. LESTER, *Assistant Examiner.*

U.S. Cl. X.R.

29—578; 148—188, 189; 317—235